(12) United States Patent
LaBerge

(10) Patent No.: US 6,647,541 B2
(45) Date of Patent: Nov. 11, 2003

(54) CIRCUIT SYNTHESIS TIME BUDGETING BASED UPON WIRELOAD INFORMATION

(75) Inventor: Paul A. LaBerge, Shoreview, MN (US)

(73) Assignee: Sun Microsystems, Inc., Santa Clara, CA (US)

( * ) Notice: Subject to any disclaimer, the term of this patent is extended or adjusted under 35 U.S.C. 154(b) by 333 days.

(21) Appl. No.: 09/832,257

(22) Filed: Apr. 9, 2001

(65) Prior Publication Data

US 2001/0032331 A1 Oct. 18, 2001

Related U.S. Application Data

(63) Continuation of application No. 09/183,782, filed on Oct. 30, 1998, now Pat. No. 6,233,724.

(51) Int. Cl.[7] .............................................. G06F 17/50
(52) U.S. Cl. ............................. 716/18; 716/6; 716/3; 716/5
(58) Field of Search .................................. 716/18, 1–17

(56) References Cited

U.S. PATENT DOCUMENTS

| | | |
|---|---|---|
| 5,426,591 A | 6/1995 | Ginetti et al. |
| 5,586,046 A | 12/1996 | Feldbaumer et al. |
| 5,629,860 A | 5/1997 | Jones et al. |
| 5,650,938 A | 7/1997 | Bootehsaz et al. |
| 5,754,826 A | 5/1998 | Gamal et al. ............... 395/500 |
| 5,764,525 A | 6/1998 | Mahmood et al. |
| 5,812,416 A | 9/1998 | Gupte et al. |
| 5,831,868 A | 11/1998 | Beausang et al. |
| 5,867,396 A | 2/1999 | Parlour |
| 5,903,466 A | 5/1999 | Beausang et al. |
| 5,910,897 A | 6/1999 | Dangelo et al. |
| 5,933,356 A | 8/1999 | Rostoker et al. |
| 6,026,228 A | 2/2000 | Imai et al. ............. 395/500.19 |
| 6,066,178 A | 5/2000 | Bair et al. ...................... 716/2 |
| 6,233,724 B1 * | 5/2001 | LaBerge ...................... 716/18 |

OTHER PUBLICATIONS

Publication: "Integrating logic synthesis into a full chip ASIC design system", Seattle Silicon Corp., Bellevue, WA, USA, IEEE Xplore Citation, Sep. 1989.
Publication: "Digital design from concept to prototype in hours", Dept. of Comput. Sci., California Univ., Riverside, CA, USA, IEEE Xplore Citation, Dec. 1994.
Publication: "Logic synthesis–a faster route to silicon", IEEE Xplore Citation, Dec. 1989.

* cited by examiner

Primary Examiner—Matthew Smith
Assistant Examiner—Magid Y Dimyan
(74) Attorney, Agent, or Firm—Park, Vaughan & Fleming LLP

(57) ABSTRACT

One embodiment of the present invention provides a system for synthesizing a circuit that allocates propagation delay between modules in the circuit based upon wireload information. The system receives a circuit divided into modules coupled together by a number of signal lines. The system defines a first set of timing constraints, and uses the first set of timing constraints to compile the circuit from a hardware description language specification into a first gate-level implementation. Next, the system performs a timing analysis on the first gate-level implementation to determine positive or negative slack values for the signal lines. These slack values specify amounts of extra propagation delay available on the signal lines. Next, the slack values are used to define a second set of timing constraints by allocating the slack values between the modules based upon wireload information. This wireload information may include such parameters as gate delays and drive strengths for gates coupled to the signal lines. The second set of timing constraints is used to compile the circuit into a second gate-level implementation. If necessary, the process of compilation, timing analysis and allocation of slack values may be repeated until the circuit meets all timing constraints.

27 Claims, 5 Drawing Sheets

TIME (ns)

| GATE TYPE | 0.5 | 1.0 | 1.5 | 2.0 | 3.0 | 4.0 |
|---|---|---|---|---|---|---|
| AND2E | 0.1 | 0.2 | 0.25 | 0.3 | 0.4 | 0.5 |
| ⋮ | | | | | | |
| OR2C | 0.3 | 0.6 | 0.8 | 1.0 | 1.2 | 1.5 |
| ⋮ | | | | | | |
| NAND3A | 1.0 | 2.0 | 3.0 | 3.5 | 4.0 | 4.3 |
| NAND3B | 0.5 | 1.0 | 1.5 | 1.8 | 2.0 | 2.2 |
| NAND3C | 0.3 | 0.5 | 0.8 | 0.9 | 1.0 | 1.1 |
| ⋮ | | | | | | |
| XNOR3C | 0.3 | 0.5 | 0.7 | 0.8 | 0.9 | 1.0 |
| ⋮ | | | | | | |

FIG. 5

CIRCUIT SYNTHESIS TIME BUDGETING BASED UPON WIRELOAD INFORMATION

RELATED APPLICATION

This application is a continuation of U.S. patent application Ser. No. 09/183,782, entitled, "Circuit Synthesis Time Budgeting Based Upon Wireload Information," by inventor Paul A. LeBerge filed on Oct. 30, 1998, now U.S. Pat. No. 6,233,724. This application hereby claims priority under 35 U.S.C. §120 to U.S. patent application Ser. No. 09/183,782, now U.S. Pat. No. 6,233,724.

BACKGROUND

1. Field of the Invention

The present invention relates to computer-aided design tools for electrical circuits, and more particularly to a methodology for synthesizing a circuit from a hardware description language specification into a gate-level implementation of the circuit.

2. Related Art

Circuit design is presently accomplished primarily through the use of computer aided design (CAD) tools, which take as input a circuit specification and automatically generate circuit descriptions suitable for implementation. Circuits are initially specified in a hardware description language, such as VHDL or Verilog. The VHDL standard is codified in Institute for Electrical and Electronic Engineers (IEEE) standard 1076-1993. The Verilog standard is codified in IEEE standard 1364-1995.

A hardware description language (HDL) specification of a circuit typically includes a set of equations that specify how the circuit behaves functionally. These equations are "synthesized" into a gate-level implementation of the circuit, which specifies the logic gates that are used to implement the circuit as well as the interconnections between the logic gates. After the circuit is synthesized into an implementation, the system typically performs placement and routing operations on the implementation to produce a final layout for the circuit.

As new semiconductor processing technologies make it possible to integrate larger numbers of devices on a semiconductor chip, circuit designs are growing increasing more complex, involving progressively larger numbers of gates. Unfortunately, the synthesis process can take a great deal of time for larger circuits, because many of the operations performed by the synthesis tool require super-linear, and even exponential execution time. To remedy this problem, a circuit designer typically breaks up a large circuit into smaller modules, which are coupled together by inter-module signal lines. The circuit designer then defines a set of timing constraints on the inter-module signal lines to "budget" propagation delay between the modules. Next, modules are separately compiled to arrive at a gate-level implementation. Finally, the timing for the circuit is analyzed to determine whether the circuit meets its timing requirements. If not, the timing constraints are adjusted to re-budget the propagation delay, and the process is repeated until the timing requirements are ultimately met.

The process of defining and adjusting timing constraints is referred to as "time budgeting." The more accurate the time budgeting process is, the faster the synthesis process will converge to an implementation that meets timing requirements. Time budgeting is typically accomplished by looking at the number of logic levels (or gates) that a signal path traverses within a module, and adjusting the constraints based upon the number of logic levels. However, as semiconductor technologies move deeper into sub-micron geometries, the number of logic levels becomes increasingly less important. Instead, the amount of wire, or wire load becomes the dominant factor in determining the timing of a design.

Hence, what is needed is a computer aided design tool that performs time budgeting based for the synthesis process based upon wire load, not the number of logic levels.

SUMMARY

One embodiment of the present invention provides a system for synthesizing a circuit that allocates propagation delay between modules in the circuit based upon wireload information. The system receives a circuit divided into modules coupled together by a number of signal lines. The system defines a first set of timing constraints, and uses the first set of timing constraints to compile the circuit from a hardware description language specification into a first gate-level implementation. Next, the system performs a timing analysis on the first gate-level implementation to determine positive or negative slack values for the signal lines. These slack values specify amounts of extra propagation delay available on the signal lines. Next, the slack values are used to define a second set of timing constraints by allocating the slack values between the modules based upon wireload information. This wireload information may include such parameters as gate delays and drive strengths for gates coupled to the signal lines. The second set of timing constraints is used to compile the circuit into a second gate-level implementation. If necessary, the process of compilation, timing analysis and allocation of slack values may be repeated until the circuit meets all timing constraints.

BRIEF DESCRIPTION OF THE FIGURES

FIG. 5 illustrates a table for adjusting propagation delays between modules in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital video discs), and computer instruction signals embodied in a carrier wave.

Computer System

Figure 1:
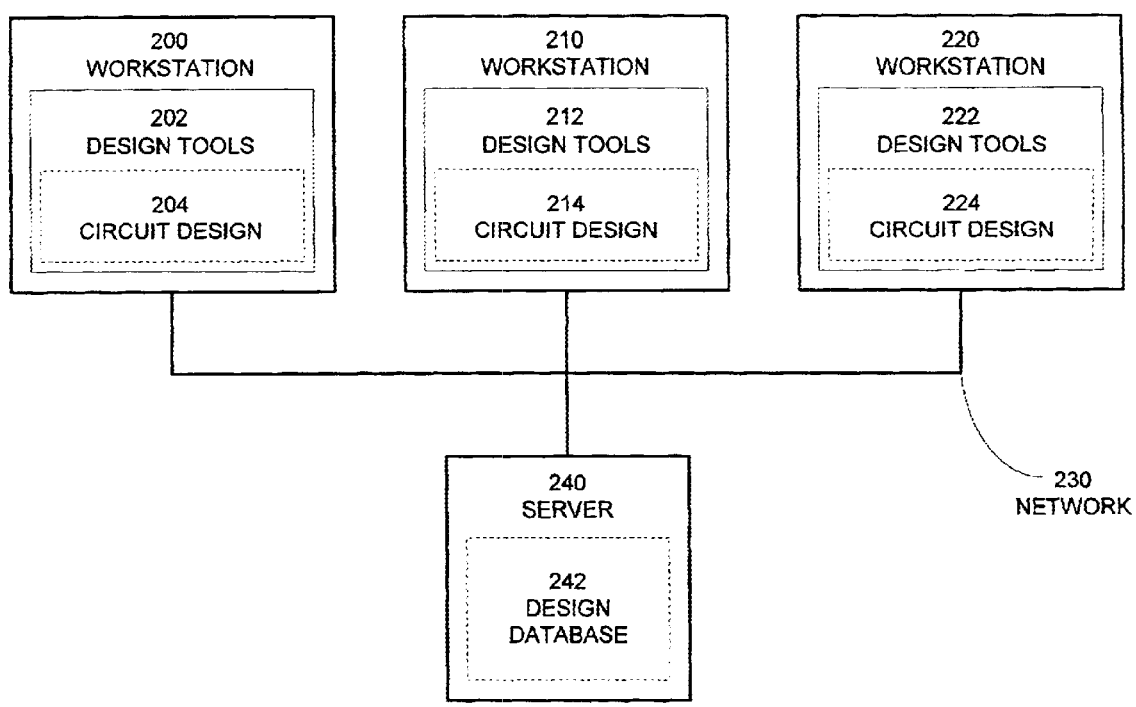
FIG. 1 illustrates a computer system including computer-aided design tools in accordance with an embodiment of the present invention.

FIG. 1 illustrates a computer system including computer-aided design (CAD) tools accordance with an embodiment of the present invention. The computer system illustrated in FIG. 2 includes a plurality of workstations 100, 110 and 120 coupled together through network 130 to server 140. Workstations 100, 110 and 120 may be any type of computing system on which CAD tools may be run. This includes, but is not limited to, workstations, personal computers, mainframe computers, supercomputers and portable computers. Network 130 may be any type of communication network through which computers can communicate. This includes, but is not limited to, local area networks, such as Ethernet or Token ring networks, and wide area networks, such as the Internet. Server 140 is any type of computational server capable of storing code and data that can be accessed by other computer systems over network 130.

Workstation 100 includes design tools 102, which include computer-aided design (CAD) tools for designing electrical circuitry. In one embodiment of the present invention, design tools 102 are configured to design integrated circuits. To this end, design tools 102 may include tools to perform synthesis, placement and routing of logic circuits, as well as tools to simulate and test logic circuits. In the illustrated embodiment, design tools 102 include a circuit design 104. Circuit design 104 may initially assume the form of a hardware description language specification, which is ultimately compiled into a gate-level implementation. Workstation 110 similarly includes corresponding design tools 112, which include a corresponding circuit design 114. Workstation 120 also includes corresponding design tools 122, which include corresponding circuit design 124.

FIG. 1 illustrates a system with three workstations, 100, 110 and 120 coupled to server 140. However, the present invention is applicable to systems including any number of workstations. Alternatively, the present invention may operate in a stand-alone computer system, such as a workstation, a personal computer, or a mainframe computer.

Server 140 includes a data storage medium for storing shared data. In one embodiment, this takes the form of a plurality of magnetic disk drives. Server 140 also includes design database 142, which is any type of database system that permits access by multiple users. Design database 142 may include designs for modules of a circuit, which are ultimately used to design a complete circuit.

Synthesis Functional Modules

Figure 2:
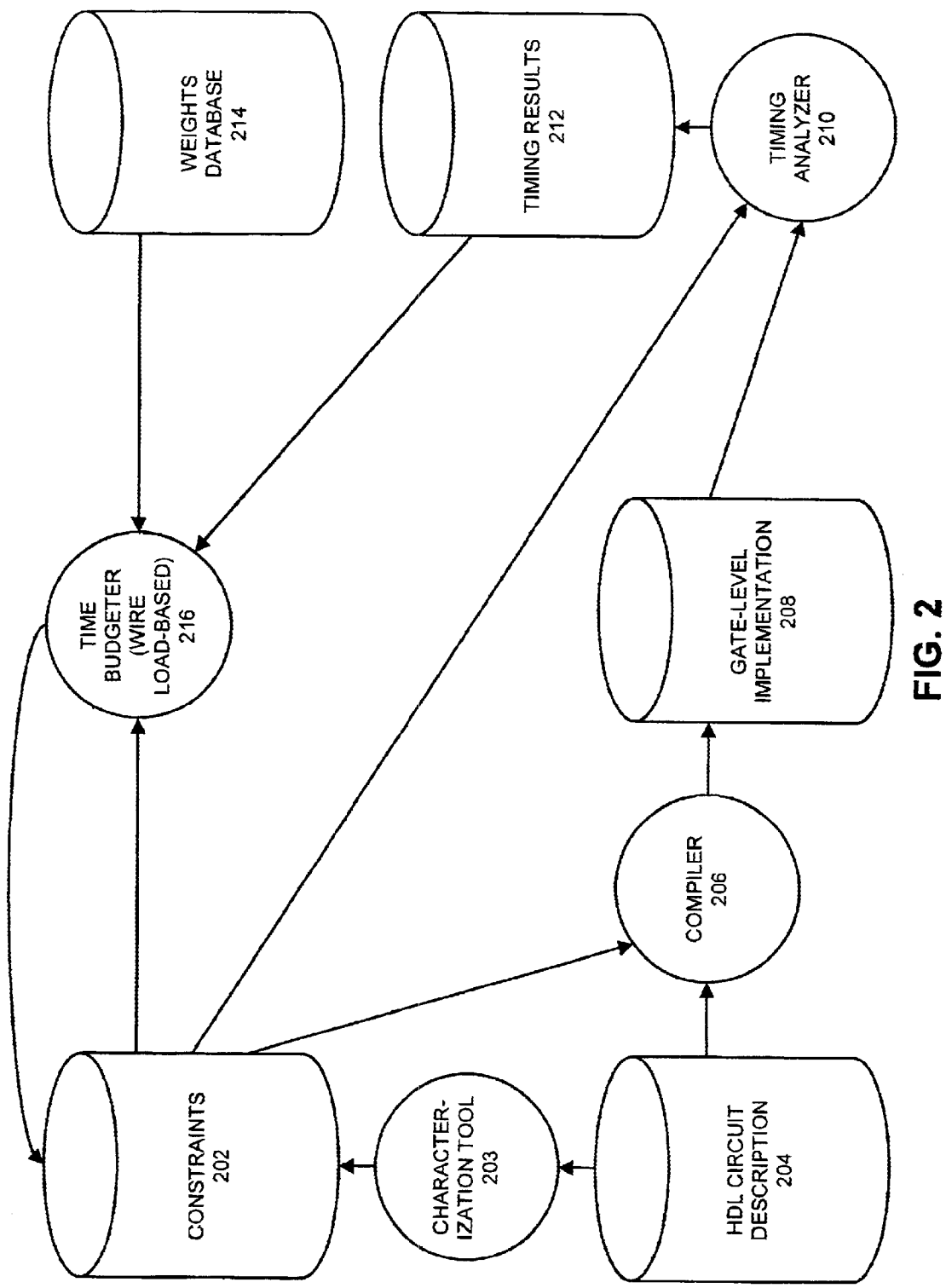
FIG. 2 illustrates some of the major modules involved in the synthesis process in accordance with an embodiment of the present invention.

FIG. 2 illustrates some of the major functional modules involved in the synthesis process in accordance with an embodiment of the present invention. The circuit initially starts in HDL format, which is illustrated by HDL circuit description 204. HDL circuit description 204 may be represented in a number of HDL formats, such as Verilog or VHDL. Alternatively, the circuit may be described in an internal representation derived from a HDL description. For example, the circuit may be described in the ".db" format, which is an internal representation specific to SYNOPSYS™ computer-aided circuit design tools. Synopsys is a trademark of the Synopsys, Inc. of Mountain View, Calif.

HDL circuit description 204 is combined with constraints 202 in compiler 206. Constraints 202 include a set of constraints that can specify both high-level constraints and low-level constraints for the circuit. For example, constraints 202 may specify low-level timing constraints on individual signal lines that couple together various modules of the circuit. At a higher level, constraints 202 may specify a global clock speed for the circuit. In general, constraints 202 may specify any other type of design constraint for the gate-level implementation.

The initial values for constraints 202 may be set by default, or alternatively, by estimating a first set of timing constraints by examining logic equations for the circuit. This process of estimation is performed by characterization tool 203 in FIG. 2, which takes HDL circuit description 204 as an input and produces an initial set of constraints, which feeds into constraints module 202.

Compiler 206 uses HDL circuit description 204 and constraints 202 to create gate-level implementation 208. Gate-level implementation 208 specifies a collection of logic gates to implement the logic equations specified in HDL circuit description 204, as well as specifying the connections between logic gates. In producing a gate-level implementation 208, compiler 206 attempts to meet any constraints specified in constraints module 202, which may include timing constraints on inter-module signal lines. Note that the steps of placement and routing of the gate level-implementation to ultimately produce a final layout for the circuit, take place later in the design process, after the synthesis process is complete.

Once a gate-level implementation 208 is produced, it is fed through timing analyzer 210, which simulates the timing of the gate-level implementation 208 to determine if gate level implementation 208 meets the specified constraints 202. For each signal line with a timing constraint, timing analyzer 210 determines whether or not the circuit meets the timing constraint. If so, timing analyzer 210 determines how much "slack" time is available in the signal line. If not, timing analyzer 210 determines how much "negative slack" is available. The term "negative slack" refers to the amount of time by which the circuit violates a timing constraint. For example, if a constraint specifies that a given signal can take at most 4.0 nanoseconds, and it actually takes 6.0 nanoseconds, the amount of negative slack is 2.0 nanoseconds. The positive and negative slack values as well as other information on propagation delay through gates comprise a portion of timing results 212.

Time budgeter 216 takes as input timing results 212, constraints 202 and weights from weights database 214, and uses these quantities to produce a new set of constraints 202. This new set of constraints 202 is arrived at by distributing positive slack and negative slack values for signal lines between the modules to which the signal lines connect. For example, if a signal line connecting a first module and a second module has 3.0 nanoseconds of negative slack, time budgeter 216 attempts to squeeze time out of circuitry within the first and second modules to achieve the optimum gate level-implementation. For example, time budgeter 216 may try to squeeze 2.0 nanoseconds out of the first module and 1.0 nanosecond out of the second module.

In making budgeting determinations, time budgeter 216 uses weights from weights database 214 to determine how much time can be squeezed out of individual gates on signal paths through circuit modules. This process is described in more detail below with reference to FIGS. 3–5.

When a new set of constraints 202 is finally produced, the constraints are used by compiler 206 to produce a new gate-level implementation 208. This process is repeated until the circuit ultimately meets global timing constraints, or the circuit is redesigned.

Synthesis Process

Figure 3:
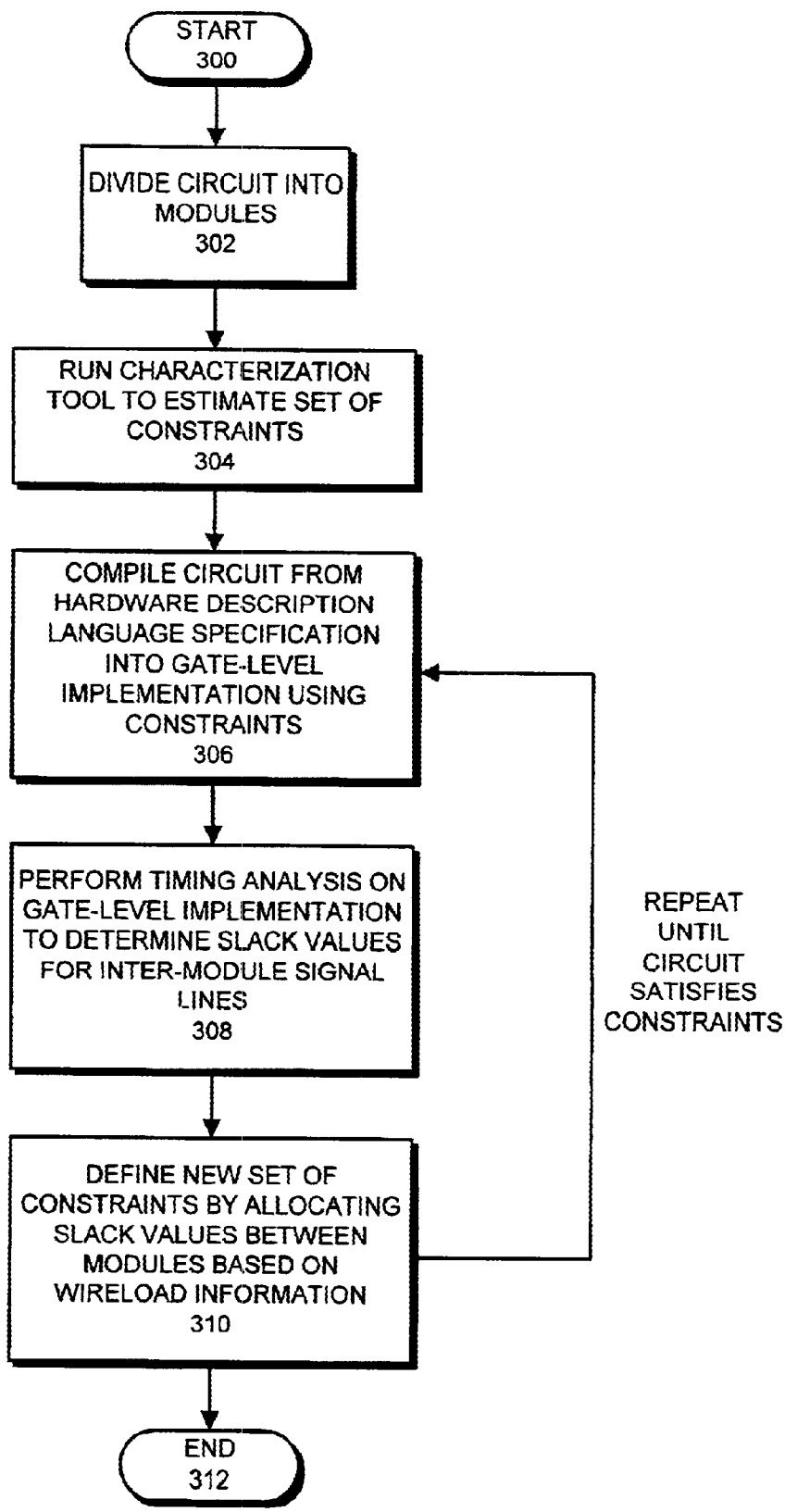
FIG. 3 presents a flow chart illustrating the synthesis process in accordance with an embodiment of the present invention.

FIG. 3 presents a flow chart illustrating the synthesis process in accordance with an embodiment of the present invention. The circuit is first partitioned into a plurality of circuit modules coupled together by a number of inter-module signal lines (step 302). As mentioned above, the circuit is partitioned for performance reasons, because the entire circuit is too large to be compiled as a single unit in any practical amount of time. The partitioning is performed with the general goal of placing functional units that tend to interact with each other into the same module. Another goal is to minimize the number of inter-module signal lines, especially time-critical inter-module signal lines.

Next, the system runs characterization tool 203 from FIG. 2 to estimate an initial set of constraints 202 (step 304). For example, one embodiment of characterization tool 203 is produced by Synopsys, Inc. of Mountain View, Calif., and operates on a logical HDL description of a circuit to estimate initial constraints.

Next, as described above, gate-level implementation 208 is produced by running compiler 206 on HDL circuit description 204 using constraints 202 (step 306). Gate-level implementation 208 is then fed through timing analyzer 210 along with constraints 202 to produce timing results 212 (step 308). Timing results 212 include positive and/or negative slack values for timing constraints on inter-module signal lines.

After the slack values have been determined, the system defines a new set of constraints 202 by allocating slack values on signal lines between modules to which the signal lines connect (step 310). In one embodiment of the present invention, this allocation process is accomplished by examining signal paths through the modules associated with inter-module signal lines. The system examines propagation delays through gates along the signal paths, as well as the drive strength of the gates (and possibly other parameters) to estimate how to allocate slack. This process is described in more detail below for a specific example with reference to FIGS. 4–5.

If the system is successful in meeting timing constraints, the system finishes with a final gate-level implementation. If not, the system repeats steps 306, 308 and 310 until timing constraints are met. If the system performs a large number of iterations without meeting timing constraints, the design can be changed by adjusting the partitioning of the in step 302, or by relaxing the timing constraints. Note that relaxing timing constraints typically saves on the area occupied by a circuit layout.

Circuit Example

Figure 4:
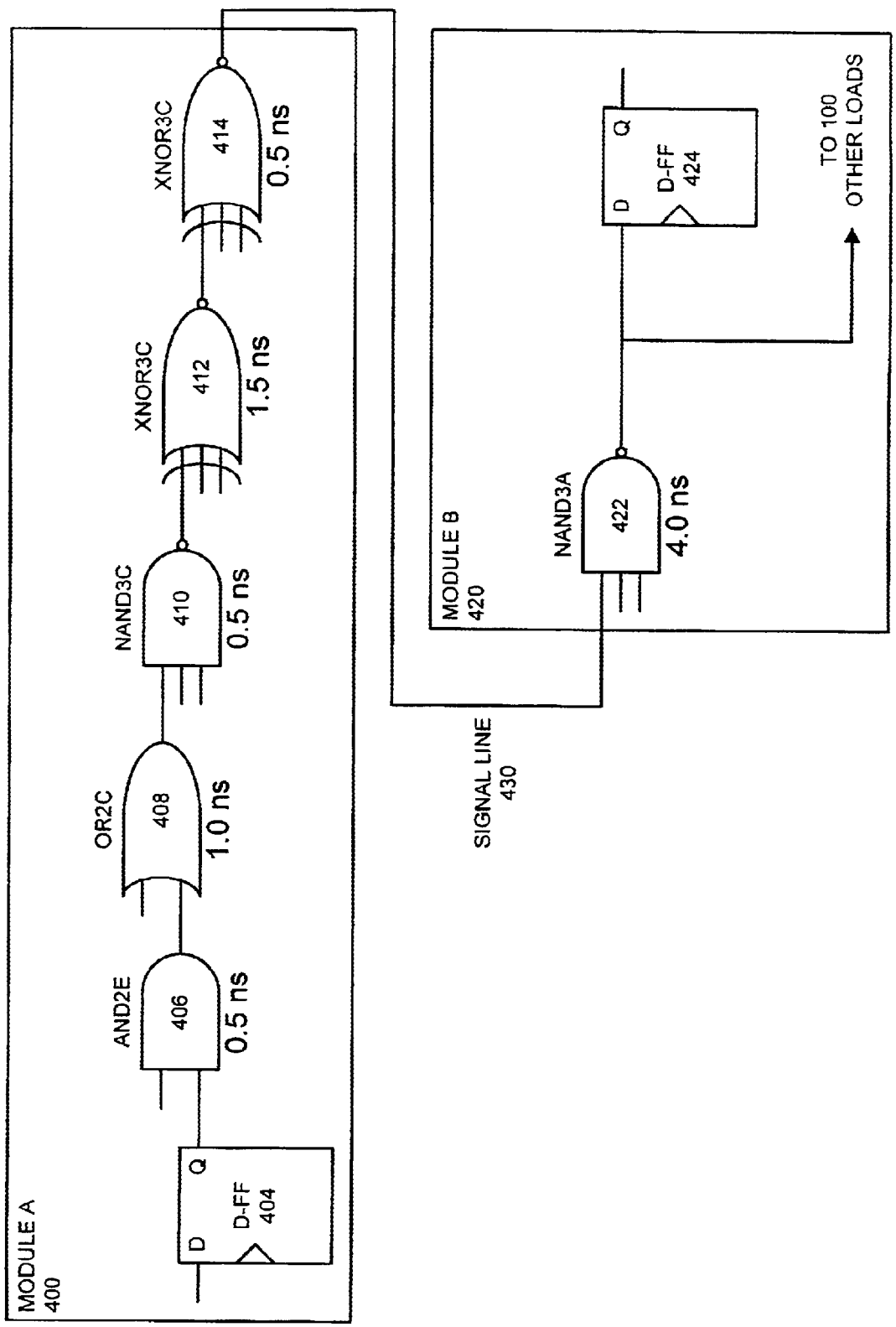
FIG. 4 illustrates an example circuit to be optimized by the synthesis process in accordance with an embodiment of the present invention.

FIG. 4 illustrates a circuit to be optimized during the synthesis process in accordance with an embodiment of the present invention. This example illustrates a single signal line 430, which couples together module A 400 and module B 420. However, note that a circuit typically includes many more modules coupled together by hundreds and possibly thousands of signal lines.

The signal path passing through signal line 430 originates in module A 400 and passes into module B 420. Within module A 400, the signal path starts a D flip-flop 404, and passes through a number of gates, including AND gate 406, OR gate 408, NAND gate 410, XNOR gate 412 and XNOR gate 414. AND gate 406 is a two-input and gate with a drive strength indicated by the symbol "E," which indicates a relatively large driver. In this example, gates typically have driver strengths from "A" to "F," with "A" indicating the weakest drive strength and "F" indicating a strong drive strength. Each gate also has a propagation delay value associated with it determined from a previous timing analysis of the gate. For example, AND gate 406 has a propagation delay of 0.5 nanoseconds.

The other gates in module A 400 have similar parameters. OR gate 408 is a two-input gate with a "C" drive strength and a propagation delay of 1.0 nanoseconds. NAND gate 410 is a three-input gate with a "C" drive strength and a propagation delay of 0.5 nanoseconds. XNOR gate 412 is a three-input gate with a "C" drive strength and a propagation delay of 1.5 nanoseconds. XNOR gate 414 is a three-input gate with a "C" drive strength and a propagation delay of 0.5 nanoseconds.

Within module B 420, the signal path passes through NAND gate 422 before feeding into D flip-flop 424. The output of NAND gate 422 also feeds into 100 other loads (not shown), which creates a very large aggregate load on NAND gate 244. NAND gate 422 is a three-input gate with an "A" drive strength and a propagation delay of 4.0 nanoseconds. This large propagation delay is caused by the small "A" drive strength of NAND gate 422 being applied to the large output load on NAND gate 422.

Suppose that there exist 2.0 nanoseconds of negative slack on signal line 430. This indicates that the propagation delay from D flip-flop 404 to D flip-flop 424 needs to be reduced by 2.0 nanoseconds. An unsophisticated time budgeter would simply allocate the slack in proportion to the number of logic levels in module A 400 and module B 420. In this case, there are five logic levels in module A 400 and only one logic level in module B 420. Hence, ⅚ (1.67 nanoseconds) of the negative slack will be allocated to module A 400 and ⅙ (0.33 nanoseconds) of the negative slack will be allocated to module B 420. In other words, the system will attempt to squeeze 1.67 nanoseconds out of module A 400 and 0.33 nanoseconds out of module B 420. This is not a good result because all of the gates in module A 400 have relatively small propagation delays and large drive strengths. It is much easier to squeeze propagation delay out of module B by increasing the drive strength of NAND gate 422 to drive the large load at the output of NAND gate 422.

One embodiment of the present invention allocates slack based upon propagation delay through gates and drive strengths of the gates. This embodiment uses the table of coefficients illustrated in FIG. 5 to adjust propagation delay between modules. The table in FIG. 5 contains a different coefficient for each gate type and propagation delay combination. In general, gates with small drive strengths and large propagation delays are assigned a large coefficient, indicating that increasing the drive strength is likely decrease gate delay. On the other hand, gates with large drive strengths and small propagation delays are assigned smaller coefficients, indicating that little is likely to be gained by modifying these gates.

For each gate in module A 400 and module B 420, the system looks up the corresponding coefficient in the table in FIG. 5. For the gates 406, 408, 410, 412 and 414 in module A 400, the coefficients are 0.1, 0.6, 0.3, 0.7 and 0.3, respectively. For gate 422 in module B the coefficient is 4.3. Next, the system sums up the coefficients for each module and allocates the slack in proportion to the sums. In this case, the sum in module A 400 is 0.1+0.6+0.3+0.7+0.3=2.0 and the sum in module B 420 is 4.3. A fraction of the slack (2.0 nanoseconds)(2.0/(2.0+4.3))=0.635 nanoseconds is allocated to module A 400, and the remainder (1.365 nanoseconds) is allocated to module B 420.

This leads to a much better result that purely allocating the slack based upon the number of logic levels because more propagation delay can be gained from increasing the small driver in gate 422 in module B 420 than can be gained from increasing the drive strengths in gates 406, 408, 410, 412 and 414 in module A 400.

Note that the above example allocates slack based upon gate delays and gate types. However, in general the present invention can take into account other information, such as the actual load on gate outputs. This load may be expressed in terms of capacitive load, resistive load and number of loads.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for synthesizing a circuit that allocates propagation delay between modules in the circuit based upon wireload information, comprising:
   receiving the circuit, the circuit being divided into a plurality of modules coupled together by a plurality of signal lines;
   defining a first set of timing constraints for the plurality of signal lines;
   compiling the circuit from a hardware description language specification into a first gate-level implementation using the first set of timing constraints;
   performing a timing analysis on the first gate-level implementation to determine a first set of slack values for the plurality of signal lines, wherein the first set of slack values specify amounts of extra propagation delay that are available on the plurality of signal lines;
   defining a second set of timing constraints by allocating the first set of slack values between the plurality of modules based upon wireload information, such that a given slack value associated with a given signal line is allocated between modules coupled to the given signal line in proportion to summed coefficients determined within each module for each gate type and propagation delay combination;
   wherein wireload information includes gate delays and drive strengths for gates coupled to the plurality of signal lines; and
   compiling the circuit from the hardware description language specification into a second gate-level implementation using the second set of timing constraints.

2. The method of claim 1, wherein the act of determining the first set of slack values includes determining slack values that can be positive or negative, a positive slack value indicating that extra propagation delay is available on a corresponding signal line, and a negative slack value indicating that a propagation delay on the corresponding signal line violates a timing constraint.

3. The method of claim 1, wherein wireload information includes a number of loads on the given signal line.

4. The method of claim 1, wherein wireload information includes capacitive loading information for signal lines.

5. The method of claim 1, wherein wireload information includes resistive loading information for signal lines.

6. The method of claim 1, wherein at least part of the wireload information is retrieved from a table that is indexed by gate-level drive strength and propagation delay.

7. The method of claim 1, wherein the act of defining the first set of timing constraints includes defining default values for the first set of timing constraints.

8. The method of claim 1, wherein the act of defining the first set of timing constraints includes estimating the first set of timing constraints by examining logic equations for the circuit.

9. The method of claim 1, further comprising:
   performing a timing analysis on the second gate-level implementation to determine a second set of slack values for the plurality of signal lines;
   defining a third set of timing constraints by allocating the second set of slack values between the plurality of modules based upon wireload information; and
   compiling the circuit from the hardware description language specification into a third gate-level implementation using the third set of timing constraints.

10. The method of claim 9, further comprising iteratively repeating the acts of performing the timing analysis on the second gate-level implementation, defining the third set of timing constraints and compiling the circuit into the third gate-level implementation until the circuit satisfies the third set of timing constraints.

11. The method of claims 1, wherein compiling the circuit from the hardware description language specification, includes compiling the circuit from a VHDL specification.

12. The method of claim 1, wherein compiling the circuit from the hardware description language specification, includes compiling the circuit from a VERILOG specification.

13. The method of claim 1, wherein allocating the first set of slack values between the plurality of modules based upon wireload information, includes for a given signal path that couples together a first module and a second module:
   examining gates on a signal path that passes through the given signal line;
   calculating for each gate on the signal path a weight, which is a function of gate delay and gate drive strength;
   calculating a first sum of weights for gates on the signal path within the first module;
   calculating a second sum of weights for gates on the signal path within the second module; and
   allocating a slack value associated with the signal line between the first module in proportion to relative values of the first sum and the second sum.

14. A method for synthesizing a circuit that allocates propagation delay between modules in the circuit based upon wireload information, comprising:
   receiving the circuit, the circuit being divided into a plurality of modules coupled together by a plurality of signal lines;
   estimating a first set of timing constraints by examining logic equations for the circuit;
   compiling the circuit from a hardware description language specification into a first gate-level implementation using the first set of timing constraints;
   performing a timing analysis on the first gate-level implementation to determine a first set of slack values for the plurality of signal lines, wherein the first set of slack values specify amounts of extra propagation delay that are available on the plurality of signal lines;
   defining a second set of timing constraints by allocating the first set of slack values between the plurality of modules based upon wireload information, such that a given slack value associated with a given signal line is allocated between modules coupled to the given signal line in proportion to summed coefficients determined within each module for each gate type and propagation delay combination;

wherein wireload information includes gate delays and drive strengths for gates coupled to the plurality of signal lines, and at least part of the wireload information is retrieved from a table that is indexed by gate-level drive strength and propagation delay;

compiling the circuit from the hardware description language specification into a second gate-level implementation using the second set of timing constraints; and iteratively repeating the acts of performing the timing analysis, defining timing constraints and compiling the circuit until the circuit satisfies a set of timing constraints.

15. A computer readable storage medium storing instructions that when executed by a computer cause the computer to perform a method for synthesizing a circuit that allocates propagation delay between modules in the circuit based upon wireload information, comprising:

receiving the circuit, the circuit being divided into a plurality of modules coupled together by a plurality of signal lines;

defining a first set of timing constraints for the plurality of signal lines;

compiling the circuit from a hardware description language specification into a first gate-level implementation using the first set of timing constraints;

performing a timing analysis on the first gate-level implementation to determine a first set of slack values for the plurality of signal lines, wherein the first set of slack values specify amounts of extra propagation delay that are available on the plurality of signal lines;

defining a second set of timing constraints by allocating the first set of slack values between the plurality of modules based upon wireload information, such that a given slack value associated with a given signal line is allocated between modules coupled to the given signal line in proportion to summed coefficients determined within each module for each gate type and propagation delay combination;

wherein wireload information includes gate delays and drive strengths for gates coupled to the plurality of signal lines; and compiling the circuit from the hardware description language specification into a second gate-level implementation using the second set of timing constraints.

16. An apparatus for synthesizing a circuit that allocates propagation delay between modules in the circuit based upon wireload information, comprising:

a receiving mechanism, that receives the circuit, the circuit being divided into a plurality of modules coupled together by a plurality of signal lines;

an initial constraint generator that defines a first set of timing constraints for the plurality of signal lines;

a compiler that compiles the circuit from a hardware description language specification into a first gate-level implementation using the first set of timing constraints;

a timing analyzer that performs a timing analysis on the first gate-level implementation to determine a first set of slack values for the plurality of signal lines, wherein the first set of slack values specifics amounts of extra propagation delay that are available on the plurality of signal lines;

a time budgeting mechanism that defines a second set of timing constraints by allocating the first set of slack values between the plurality of modules based upon wireload information, such that a given slack value associated with a given signal line is allocated between modules coupled to the given signal line in proportion to summed coefficients determined within each module for each gate type and propagation delay combination;

wherein wireload information includes gate delays and drive strengths for gates coupled to the plurality of signal lines; and wherein the compiler compiles the circuit from the hardware description language specification into a second gate-level implementation using the second set of timing constraints.

17. The apparatus of claim 16, wherein slack values can be positive or negative, a positive slack value indicating that extra propagation delay is available on a corresponding signal line, and a negative slack value indicating that a propagation delay on the corresponding signal line violates a timing constraint.

18. The apparatus of claim 16, wherein wireload information includes a number of loads on a given signal line.

19. The apparatus of claim 16, wherein wireload information includes capacitive loading information for signal lines.

20. The apparatus of claim 16, wherein wire load information includes resistive loading information for signal lines.

21. The apparatus of claim 16, wherein at least part of the wireload information is retrieved from a table that is indexed by gate-level drive strength and propagation delay.

22. The apparatus of claim 16, wherein the initial constraint generator is configured to define the first set of timing constraints using default values.

23. The apparatus of claim 16, wherein the initial constraint generator is configured to estimate the first set of timing constraints by examining logic equations for the circuit.

24. The apparatus of claim 16, further comprising a control mechanism that is configured to repeat the acts of performing the timing analysis, defining the second set of timing constraints and compiling the circuit until the circuit satisfies the second set of timing constraints.

25. The apparatus of claim 16, wherein the hardware description language specification includes a VHDL specification.

26. The apparatus of claims 16, wherein the hardware description language specification includes a VERILOG specification.

27. The apparatus of claims 16, wherein the time budgeting mechanism is configured to:

examine gates in a signal path that passes through a given signal line that couples together a first module and a second module;

calculate for each gate on the signal path a weight, which is a function of gate delay and drive strength;

calculate a first sum of weights for gates on the signal path within the first module;

calculate a second sum of weights for gates on the signal path within the second module; and allocate a slack value associated with the signal line between the first module in proportion to relative values of the first sum and the second sum.

* * * * *

UNITED STATES PATENT AND TRADEMARK OFFICE
CERTIFICATE OF CORRECTION

PATENT NO.    : 6,647,541 B2
DATED         : November 11, 2003
INVENTOR(S)   : LaBerge It is certified that error appears in the above-identified patent and that said Letters Patent is hereby corrected as shown below:

<u>Title page,</u>
Item [73], please delete the words, "Sun Microsystems, Inc., Santa Clara, CA (US)" and replace with the words -- Micron Technology, Inc., Boise, ID (US) --.

Signed and Sealed this

Fourth Day of May, 2004

JON W. DUDAS
*Acting Director of the United States Patent and Trademark Office*